United States Patent
Smith

[19]

[11] Patent Number: 5,882,055
[45] Date of Patent: Mar. 16, 1999

[54] PROBE FOR HANDLING MICROCHIPS

[75] Inventor: Nathan R. Smith, Stillwater, Minn.

[73] Assignee: Aetrium Incorporated, North St. Paul, Minn.

[21] Appl. No.: 797,972

[22] Filed: Feb. 12, 1997

Related U.S. Application Data

[60] Provisional application No. 60/011,461 Feb. 12, 1996.

[51] Int. Cl.⁶ .............................. B25J 15/06; B66C 1/02
[52] U.S. Cl. ........................................................... 294/64.1
[58] Field of Search .................. 294/64.1, 64.3, 294/65; 29/743; 269/21; 271/90, 103, 107; 279/3; 901/40

[56] References Cited

U.S. PATENT DOCUMENTS

| | | | |
|---|---|---|---|
| 1,130,679 | 3/1915 | Staunton | 294/64.1 X |
| 1,364,229 | 1/1921 | Williamson | 294/64.1 |
| 2,132,283 | 10/1938 | Allen | 294/64.1 |
| 2,725,255 | 11/1955 | Watter | 294/64.1 |
| 2,815,240 | 12/1957 | Lytle | 294/64.1 |
| 3,912,317 | 10/1975 | Ohnaka | 294/64.1 |
| 4,486,013 | 12/1984 | Vander Syde | 294/64.1 X |
| 4,707,012 | 11/1987 | Takagi . | |
| 4,763,941 | 8/1988 | Sniderman . | |
| 4,799,722 | 1/1989 | Marzinotto . | |
| 5,172,922 | 12/1992 | Kowaleski et al. . | |
| 5,190,332 | 3/1993 | Nagai et al. | 294/64.1 |
| 5,201,696 | 4/1993 | Kinnback et al. . | |
| 5,211,435 | 5/1993 | Nagai et al. . | |
| 5,213,385 | 5/1993 | Nagai et al. . | |
| 5,231,753 | 8/1993 | Tanaka et al. . | |
| 5,263,753 | 11/1993 | Breu et al. . | |

FOREIGN PATENT DOCUMENTS

| | | | |
|---|---|---|---|
| 562117 | 9/1993 | European Pat. Off. | 294/64.1 |
| 1512906 | 10/1989 | U.S.S.R. | 294/64.1 |
| 1671597 | 8/1991 | U.S.S.R. | 294/64.1 |
| 1000156 | 8/1965 | United Kingdom | 294/64.1 |
| 2250264 | 6/1992 | United Kingdom | 294/64.1 |

*Primary Examiner*—Johnny D. Cherry
*Attorney, Agent, or Firm*—Alan Kamrath; Peterson, Wicks, Nemer & Kamrath, P.A.

[57] ABSTRACT

A microchip handling system has a pair of probes with suction cups for handling microchips. An improved microchip holding device is used in lieu of the suction cups to pick up and hold microchips. The microchip holding device has a head accommodating an annular sleeve that retains the microchip in spaced holding relationship relative to a body. The sleeve establishes a large annular space whereby the vacuum force has a large surface area for holding the microchip in engagement with the sleeve.

12 Claims, 3 Drawing Sheets

5,882,055

PROBE FOR HANDLING MICROCHIPS

CROSS REFERENCE TO RELATED APPLICATION

This application is a continuation of U.S. Provisional Patent Application Ser. No. 60/011,461 filed Feb. 12, 1996.

FIELD OF THE INVENTION

The invention is in the field of microchip handling equipment having probes with suction members for picking up and holding microchips so that the microchips can be moved to selected locations.

BACKGROUND OF THE INVENTION

Automated object handling and assembly machines are equipped with robot arms operable to pick up and transport objects to a precise location. Microchip handling equipment have movable probes carrying cone-shaped suction cups for picking up microchips and moving them to desired locations. The probe is lowered to place the outer edge of the suction cup into physical contact with the microchip. A vacuum force applied to the inside of the suction cup causes the microchip to adhere to the cup. The cone-shaped cup has an annular flexible flange with a central opening to allow air to be withdrawn from under the flange. The vacuum causes the flexible flange to draw down on the microchip leaving only the small surface area of the central opening for the vacuum force holding the microchip on the cup. This vacuum force must be sufficient to prevent movement and separation of the microchip from the suction cup. The microchip can be damaged and cracked when subjected to high vacuum forces and impact forces. Examples of probes for microchip handlers having cone-shaped suction cups are disclosed by E. Takagi in U.S. Pat. No. 4,707,012 and N. Shigekazu et al in U.S. Pat. No. 5,211,435.

SUMMARY OF THE INVENTION

The invention is a probe having a vacuum head for handling an object, such as a microchip or circuit board, in a manner to pick up and hold the object and then move and place the object in a new location. The probe has a body supporting a movable member. The member has an outer end and a passage for carrying air to and from a source of air pressure. A cylindrical head having a flat bottom surface is connected to the outer end of the member. The head has a cylindrical outer surface and an annular groove open to the surface. An annular sleeve of flexible material has a flange extended into the annular groove and a rim in engagement with the cylindrical outer surface. The rim has an annular lower end extended downwardly below the plane of the bottom surface of the head. The lower end of the rim has a flat bottom surface adapted to be placed in surface contact with a face of the microchip. The plane of the bottom surface of the rim is below the head's bottom surface creating a cylindrical space between the head and the plane of the bottom surface of the rim. When the probe is subjected to a vacuum pressure, air is withdrawn from below the head whereby the rim is drawn into sealing relation with the microchip. The cylindrical wall of the head prevents the sleeve from collapsing on the microchip. In the preferred embodiment of the invention, the sleeve is a one-piece silicone rubber member having an inwardly-directed flange that fits into a rectangular groove that is the side wall of the head. A cylindrical rim bears against the side wall of the head and extends below the bottom surface of the head. The rim has a flat bottom surface located in a plane below the plane of the bottom surface of the head.

DESCRIPTION OF THE PREFERRED EMBODIMENT

Figure 1:
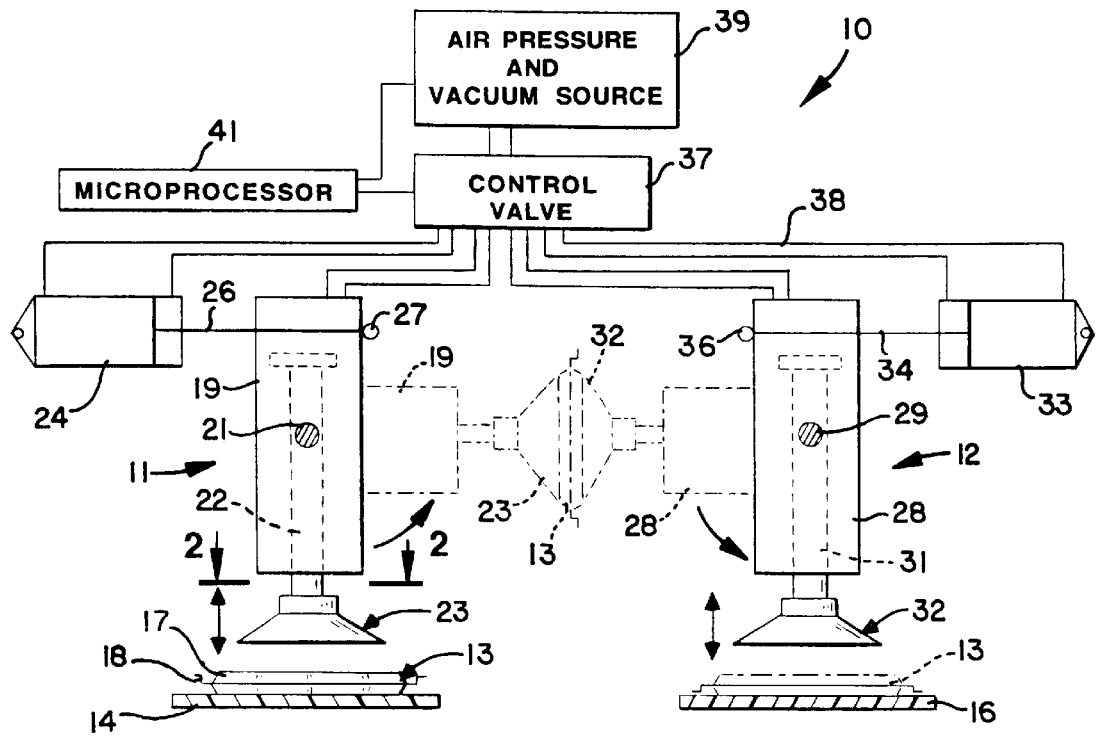
FIG. 1 is a diagrammatic view of a microchip handling system having prior art pick up probes.
Figure 2:
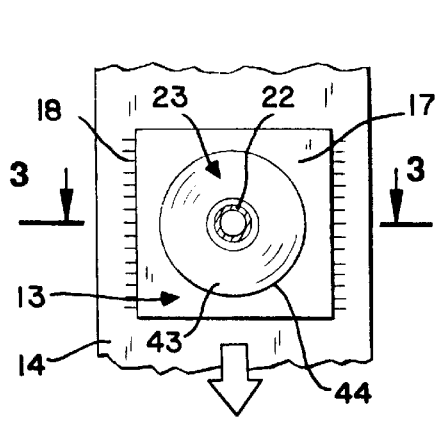
FIG. 2 is an enlarged sectional view taken along the line 2—2 of FIG. 1.

Referring to FIG. 1, there is shown a prior art microchip handling system, indicated generally at 10, having a pair of probes 11 and 12 for picking up and moving a microchip 13 from a first support 14, such as a moving belt and depositing the microchip on a second support 16, such as a second moving belt. Examples of a prior art microchip handling system having probes for picking up and moving the microchip to a second location are disclosed in U.S. Pat. Nos. 4,707,012 and 5,211,435.

Microchip 13 has a generally rectangular flat body 17 having a plurality of outwardly-directed leads 18 along the peripheral edges thereof. Microchip 13 is a conventional electronic component that is tested prior to commercial use. The microchip handling system 10 is used with testing instruments to change the positions of the microchips during movement of the microchips relative to the testing instrument. Microchip handling system 10 is usable to load and unload microchips from storage trays and tapes.

Probe 11 has a generally upright housing or cylinder 19 movably mounted on a horizontal pivot member 21. Housing 19 accommodates a reciprocating piston 22. Piston 22 has a lower end that accommodates a suction cup, indicated generally at 23. A piston and cylinder assembly 24 operates to pivot housing 19 from a generally upright position to a horizontal position, as shown in broken lines. The piston and cylinder assembly has a rod 26 that is joined to housing 19 with a pivot member 27.

Probe 12 has a housing or cylinder 28 mounted on a horizontal pivot 29. Cylinder 28 accommodates a reciprocating piston 31 having a lower end attached to a suction cup, indicated generally at 32. A piston and cylinder assembly 33, connected to a rod 34, which is joined to housing 28 with pivot member 36, operates to pivot housing 28 from a generally vertical position to a horizontal position, as shown in broken lines, to pick the microchip 13 from suction cup 23 and transfer the microchip to support 16.

Probes 11 and 12, and piston and cylinder assemblies 24 and 33 are controlled with a control valve 37. Fluid carrying lines 38 connect control valve 37 to probes 11 and 12, and piston and cylinder assemblies 24 and 33. Control valve 37 regulates the supply of air under pressure and vacuum to respective probes and piston and cylinder assemblies. The air pressure and vacuum source 39 is coupled to control valve 37. A microprocessor 41 controls the control valve and air pressure and vacuum source 39 to sequence the microchip pick up and transfer functions of the microchip handling system.

Figure 3:
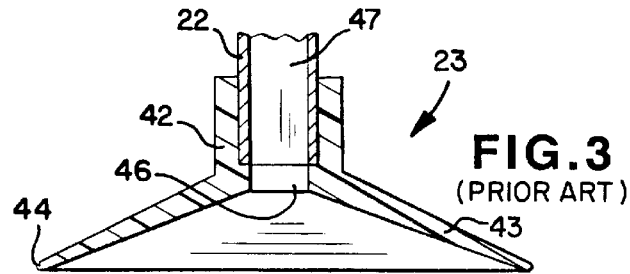
FIG. 3 is an enlarged sectional view taken along the line 3—3 of FIG. 2.
Figure 4:
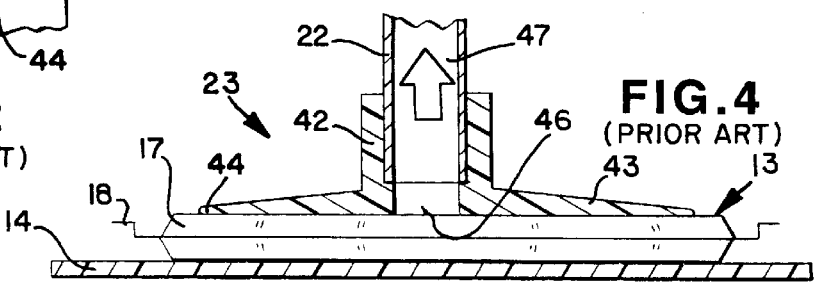
FIG. 4 is a sectional view similar to FIG. 3 showing the pick up probe in engagement with a microchip.
Figure 5:
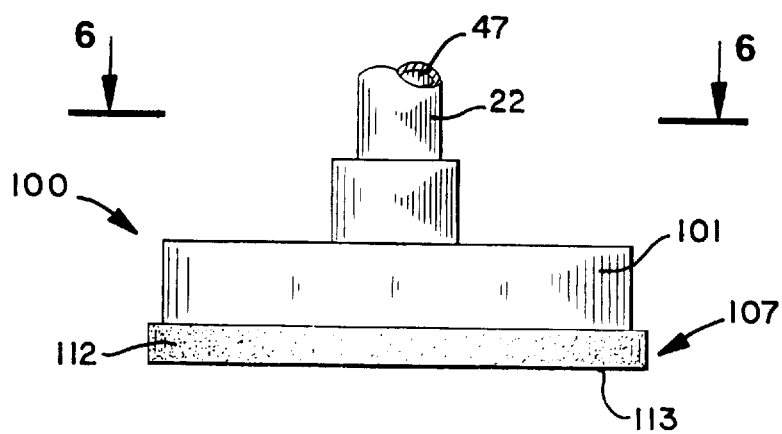
FIG. 5 is a side elevational view of a microchip pick up probe according to the invention.

As shown in FIGS. 3 and 4, suction cup 23 has an upwardly-directed cylindrical collar 42, that fits over the lower end of tubular piston 22. An outwardly-directed annular skirt 43 is joined to the lower end of collar 42 and terminates in a generally circular outer peripheral edge 44. Skirt 43 has a generally cone shape that tapers downwardly from collar 42 to outer peripheral edge 44. Skirt 43 is a flexible or rubber-like material which is impervious to air and fluids. The center of skirt 43 has a circular opening 46 in communication with passage 47 of piston 22. Opening 46 is substantially smaller in diameter than the diameter of the outer peripheral edge 44 of suction cup 23. The diameter of the outer peripheral edge 44 of suction cup 23 is about ten times the diameter of the central opening 46.

In use, when probe 11 is actuated, suction cup 23 moves down onto the top surface of microchip 13. The application of a vacuum to piston 22 draws the skirt 43 in generally flat surface contact with the top surface of microchip body 17, as seen in FIG. 4. The circular surface area of opening 46 remains subjected to the vacuum pressure. The holding force of the vacuum is relatively small, since the area of opening 46 is small, as compared to the large area of skirt 43. The relatively small holding force of the suction cup 23 on microchip 13 makes the microchip susceptible of being moved and dislodged from suction cup 23. The probe of the invention overcomes this disadvantage of suction cup 23.

Figure 6:
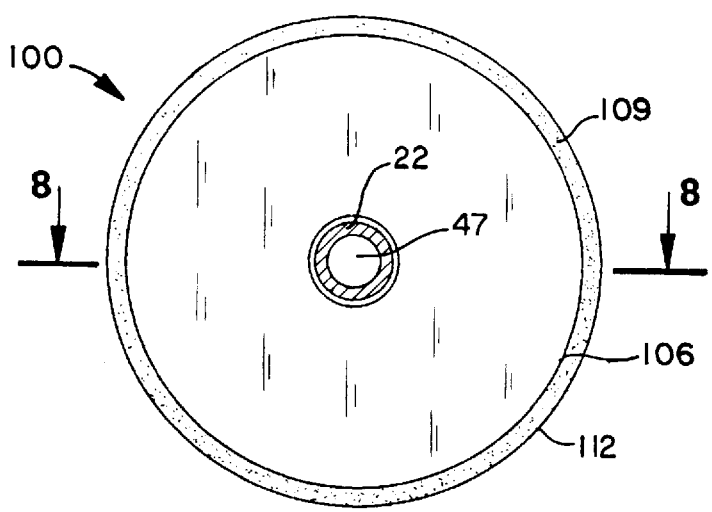
FIG. 6 is a sectional view taken along the line 6—6 of FIG. 5.
Figure 7:
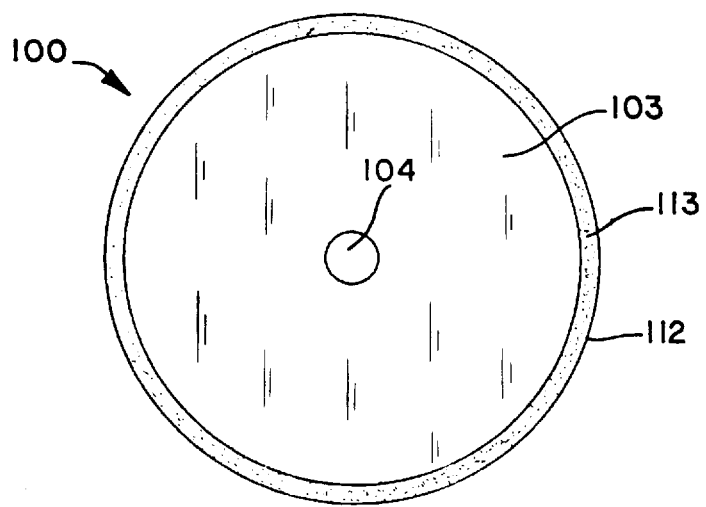
FIG. 7 is a bottom plan view of the probe of FIG. 5.

Referring to FIGS. 5–10, there is shown the microchip pick up head 100 of the invention for a probe, such as probes 11 and 12 for picking up and holding a microchip 13. Head 100 has a generally cylindrical body 101 joined to an upwardly-directed tubular neck 102. Neck 102 is threaded onto the lower end of tubular piston 22 to secure head 100 to piston 23. Body 101 has a flat annular bottom surface 103 having a central area open to an upwardly-directed passage 104. Passage 104 is in alignment and in communication with the passage 47 of tubular piston 22. The outer peripheral surface of body 101 is an annular side wall 106. As seen in FIG. 6, wall 106 is cylindrical and concentric about the vertical axis of body 101.

Figure 8:
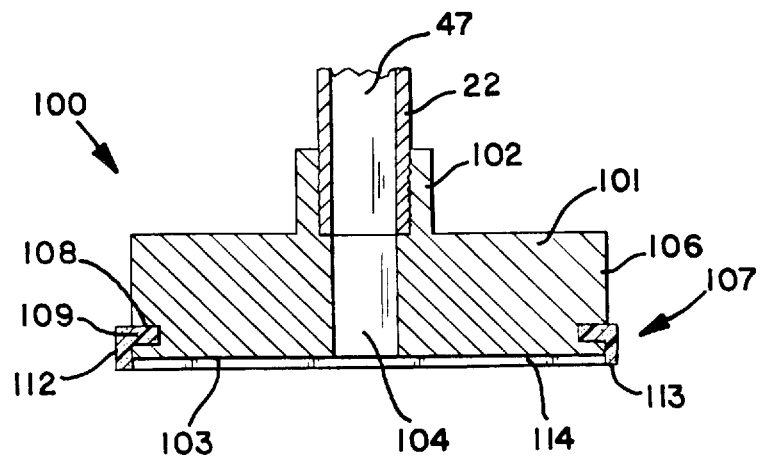
FIG. 8 is a sectional view taken along the line 8—8 of FIG. 6.
Figure 9:
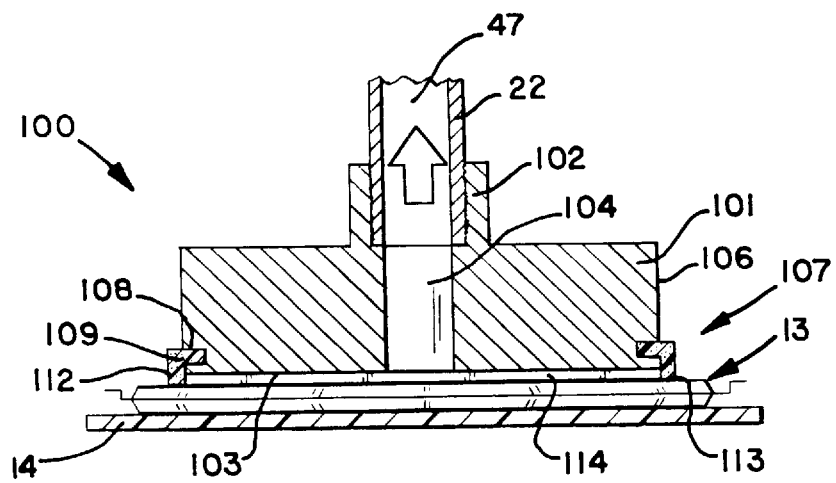
FIG. 9 is a sectional view similar to FIG. 8 showing the probe in operative engagement with a microchip.
Figure 10:
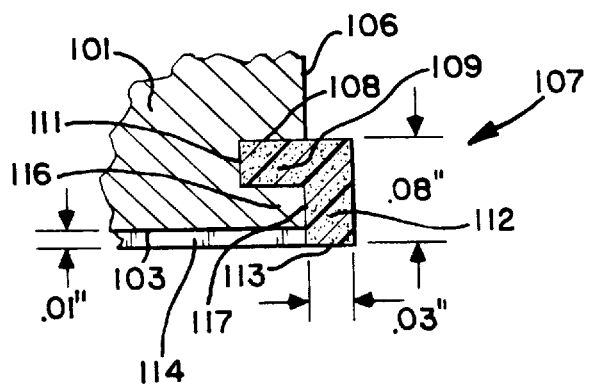
FIG. 10 is an enlarged sectional view of an outer edge portion of the holding device showing a cross section of the sealing sleeve.

Referring to FIGS. 8, 9 and 10, side wall 106 has an annular groove 108 spaced a short distance above the flat bottom surface 103. Groove 108 has a generally rectangular cross section having flat annular top and bottom surfaces.

A sleeve 107 of resilient and elastic material, such as silicone rubber, is mounted on the lower end of body 101. Sleeve 107 has an inwardly-directed continuous annular flange 109 that fits into the groove 108. Flange 109 has an annular flat top and bottom surfaces located in surface engagement with the flat top and bottom surfaces forming groove 108. The inner end 111 of flange 109 is located adjacent the bottom of groove 108. Flange 109 is joined to a downwardly-directed annular rim 112 having a continuous circular flat lower face 113. Face 113 has an annular flat surface located in a plane that is below the plane of the bottom flat surface 103 of body 101. There is an annular space 114 below bottom surface 103 of body 101 and above the plane of face 113. Rim 112 is positioned about an annular lip 116 joined to and surrounding the bottom of body 101. Lip 116 has an upright annular surface 117 that is in surface engagement with the inside surface of rim 112. Flange 109 and rim 112, being a one-piece elastic member are located in compressive surface engagement against annular surface 117 to firmly hold rim 112 on lip 116 and flange 109 in groove 108.

In use, as seen in FIG. 9, when the probe is moved in a downward direction, the flat lower surface of face 113 is positioned in surface engagement with the top surface of microchip 13. The bottom surface 103 of body 101 is located above the top surface of microchip 13 thereby retaining a large circular space 114 between bottom surface 103 and microchip 13. Vacuum pressure in space 114 establishes a holding force that firmly retains microchip 13 on rim 112 of sleeve 107. The vacuum force, being over a large area of the microchip, does not damage nor crack the microchip. The vacuum pressure draws rim 112 tight against annular surface 117. Flange 109 remains in groove 108. The annular bottom surface of face 113 is drawn into tight sealing relationship with the upper surface of the microchip. The vacuum pressure is an amount that does not subject the microchip to concentrated or extreme pressures that can damage the microchip. Rim 112 functions as an annular seal with respect to microchip 13. When the vacuum pressure in circular space 114 is released, the microchip 13 disengages the lower surface of face 113 leaving the microchip on support 14 or being held by a second probe.

Referring to FIG. 10, there is shown a preferred structure and size of sleeve 107. Sleeve 107 is a one-piece silicone rubber annular member. Flange 109 and rim 112 have substantially the same thickness, illustrated at 0.03 inch. The height of rim 112 is 0.08 inch. The vertical height of the space 114 is 0.01 inch. Sleeve 107 can have other dimensions and sizes.

While there has been shown and described a preferred embodiment of the microchip holding device of the invention, it is understood that changes in size, materials, structures and dimensions may be made by those skilled in the art without departing from the invention. The invention is defined in the following claims.

I claim:

1. A probe for handling a microchip with vacuum pressure comprising, in combination: a body, a member movably mounted on the body having an end and a passage adapted to be connected to means for establishing a vacuum pressure, a head connected to the end of the member, said head having a bottom surface, an opening connecting the passage in the member to the bottom surface, a cylindrical outside wall, and an annular groove in said outside wall above the bottom surface of the head; and, sleeve means mounted on the head for engaging the microchip and holding the microchip when vacuum pressure is applied to the passage in the member; said sleeve means having a first section located in the groove and a cylindrical rim joined to the first section located around and in compressive surface engagement against the cylindrical outside wall of the head below the groove and extended below the plane of the bottom surface of the head, with the cylindrical rim including a continuous annular flat lower face having an annular lower surface adapted to engage the microchip and locate the bottom surface of the head above the microchip and thereby retain a space between the bottom surface of the head and the microchip and hold the microchip when vacuum pressure is applied to the passage in the member and the space between the bottom surface of the head and the microchip.

2. The probe of claim 1 wherein: said head has a flat bottom surface.

3. The probe of claim 2 wherein: the opening is open to a central portion of the bottom surface of the head.

4. The probe of claim 1 wherein: the annular groove has flat upper and lower annular surfaces, said first section of the sleeve means being engageable with said upper and lower annular surfaces of the annular groove.

5. The probe of claim 4 wherein: the annular groove has a generally rectangular cross section; and wherein the first section of the sleeve means has annular flat top and bottom surfaces located in surface engagement with the flat upper and lower annular surfaces of the annular groove.

6. The probe of claim 1 wherein: said first section of the sleeve means is an inwardly-directed annular flange.

7. The probe of claim 1 wherein: the sleeve means is a one-piece flexible member.

8. The probe of claim 7 wherein: the flexible member is a silicone rubber member.

9. A probe for picking up and holding a microchip with a vacuum pressure comprising: a body, a piston having a tubular member with a passage movably mounted on the body adapted to receive vacuum pressure, said tubular member having an end spaced from the body, a cylindrical head connected to the end of the tubular member, said head having a flat bottom surface, a central opening connecting the passage of the tubular member to the center of the bottom surface, a cylindrical outside wall, and an annular groove, said outside wall above the bottom surface of the head; and sleeve means mounted on said head for engaging the microchip and holding the microchip when vacuum pressure is applied to the passage in the tubular member, said sleeve means being a one-piece flexible member having an inwardly-directed flange located in said groove and a cylindrical rim surrounding and located in engagement with the cylindrical outside wall of the head, said rim having an annular end portion extended below the plane of the bottom surface of the head, said end portion having an annular flat bottom surface adapted to engage the microchip and pick up and hold the microchip when vacuum pressure is applied to the passage in the tubular member and space between the bottom surface of the head and the microchip.

10. The probe of claim 9 wherein: the annular groove has flat upper and lower annular surfaces, said flange being engageable with said upper and lower annular surfaces of the annular groove.

11. The probe of claim 10, wherein: the annular groove has a generally rectangular cross section; and wherein the flange has annular flat top and bottom surfaces located in surface engagement with the flat upper and lower annular surfaces of the annular groove.

12. The probe of claim 9 wherein: the flexible member is a silicone rubber member.

* * * * *

UNITED STATES PATENT AND TRADEMARK OFFICE
CERTIFICATE OF CORRECTION

PATENT NO. : 5,882,055

DATED : March 16, 1999

INVENTOR(S) : Nathan R. Smith

It is certified that error appears in the above-identified patent and that said Letters Patent is hereby corrected as shown below:

Title page item [56], cancel "Kinnback" and substitute therefore --Kinback--.

Column 3, line 43, cancel "23" and substitute therefore --22--.

Column 6, line 20, cancel "10," and substitute therefore --10--.

Signed and Sealed this

Twenty-eighth Day of March, 2000

Attest:

Q. TODD DICKINSON

Attesting Officer

Commissioner of Patents and Trademarks